US010924077B2

(12) United States Patent
Wang et al.

(10) Patent No.: US 10,924,077 B2
(45) Date of Patent: Feb. 16, 2021

(54) LOW COMPLEXITY LOUDNESS EQUALIZATION

(71) Applicant: OmniVision Technologies, Inc., Santa Clara, CA (US)

(72) Inventors: Chung-An Wang, Singapore (SG); Dong Shi, Singapore (SG); Cheng-Lun Hu, Singapore (SG)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 16/116,305

(22) Filed: Aug. 29, 2018

(65) Prior Publication Data

US 2020/0076392 A1 Mar. 5, 2020

(51) Int. Cl.
*H03G 3/00* (2006.01)
*H03G 5/16* (2006.01)
*H04R 29/00* (2006.01)
*H04R 3/04* (2006.01)

(52) U.S. Cl.
CPC ............. *H03G 5/165* (2013.01); *H04R 3/04* (2013.01); *H04R 29/001* (2013.01)

(58) Field of Classification Search
CPC ................................ H03G 5/16; H03G 5/025
USPC ................................................ 381/102–103
See application file for complete search history.

(56) References Cited

U.S. PATENT DOCUMENTS

| | | | |
|---|---|---|---|
| 2005/0195986 A1* | 9/2005 | McCarty | H04R 5/02 381/79 |
| 2007/0058820 A1* | 3/2007 | Sawara | H04R 27/00 381/82 |
| 2008/0031471 A1* | 2/2008 | Haulick | H03G 3/32 381/86 |
| 2009/0047993 A1* | 2/2009 | Vasa | G11B 27/34 455/556.1 |
| 2009/0074216 A1* | 3/2009 | Bradford | H04R 25/43 381/315 |
| 2014/0064529 A1* | 3/2014 | Jang | H04R 25/505 381/317 |
| 2015/0264504 A1* | 9/2015 | Yeo | H04S 7/302 381/307 |

* cited by examiner

*Primary Examiner* — George C Monikang
(74) *Attorney, Agent, or Firm* — Christensen O'Connor Johnson Kindness PLLC

(57) ABSTRACT

An electronic device to equalize sound includes a microphone coupled to receive the sound and output sound data. The sound has amplitude that changes with respect to time, and the sound includes one or more frequencies. The sound data indexes the amplitude with respect to the time. The electronic device also includes a controller coupled to microphone, and the controller includes logic that when executed by the controller causes the electronic device to perform operations. The operations may include: receiving the sound data from the microphone with the controller; adjusting the amplitude of the sound included in the sound data across the one or more frequencies using a filter disposed in the logic; and outputting filtered sound data.

18 Claims, 6 Drawing Sheets

LOW COMPLEXITY LOUDNESS EQUALIZATION

TECHNICAL FIELD

This disclosure relates generally to sound adjustment.

BACKGROUND INFORMATION

The human auditory system perceives different frequencies with different sensitivities. For example, the range of human hearing is generally 20 Hz-20 kHz, but human ears may be more sensitive to sounds in the range of 1 kHz-4 kHz. Listeners may be able to detect low sounds like 0 dB SPL at 3 kHz, but may require 40 dB SPL at 100 hertz (which requires an amplitude increase of 100). Moreover, as humans age, the spectrum that can be heard tends to become diminished.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1A:
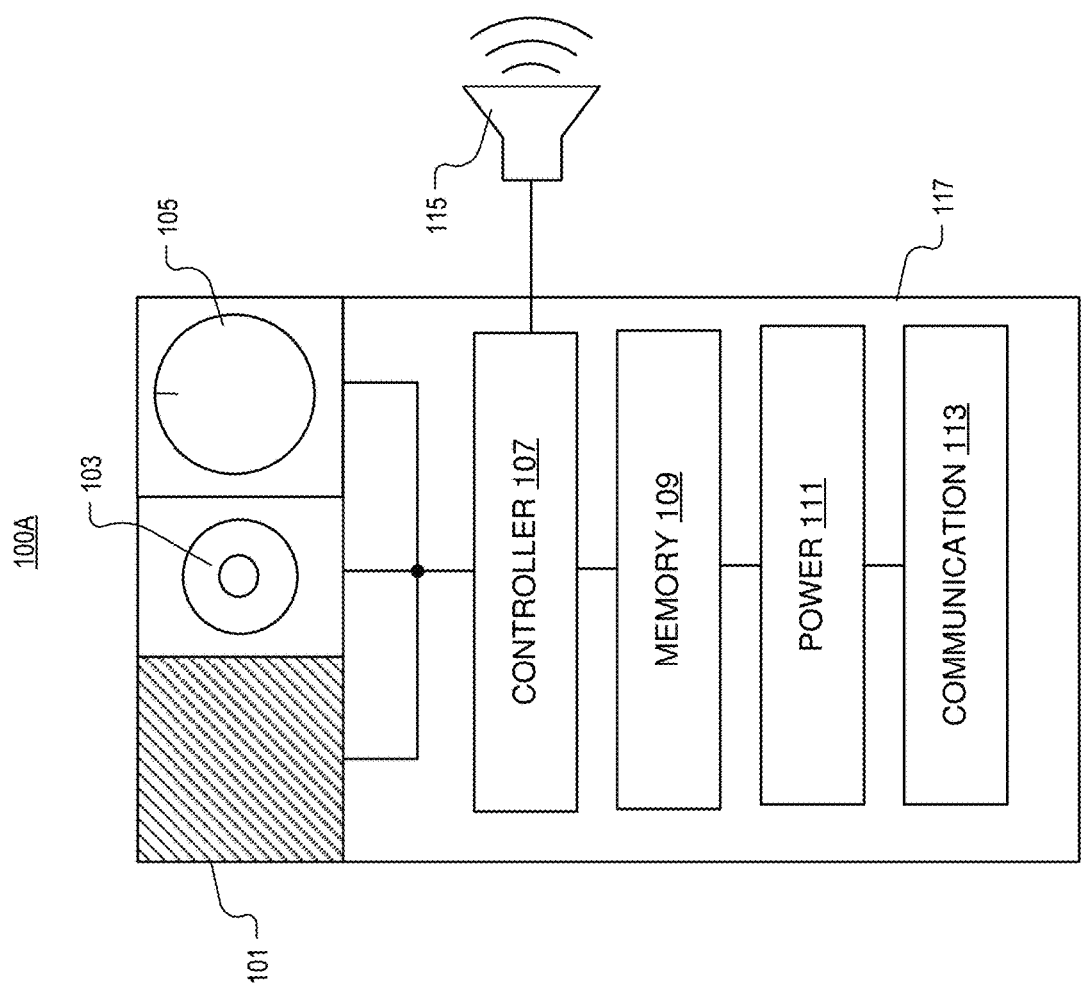
FIG. 1A illustrates an electronic device, in accordance with an example of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of a system and method for low complexity loudness equalization are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Volume control is a necessary function for almost all audio processing applications (e.g., audio playback). In the simplest form, the user inputs the desired volume (to be increased or decreased). The input is mapped to a single gain, and an input audio signal multiplies the gain to adjust loudness. However, the human auditory system perceives different frequencies with different sensitivities, and therefore different frequencies should be multiplied with different gains instead of a single gain. Accordingly, in order to achieve optimal enjoyment for users of electronic devices, the loudness of various frequencies in a signal should be adjusted separately. The processing is referred to as "loudness equalization". Thus, the appropriate gain for a signal depends on the signal's frequency.

Generally some approaches to loudness equalization may suffer from drawbacks. For example, conventional designs heavily rely on the usage of fast Fourier transforms (FFT) to convert back and forth between time and frequency domains. For large frame sizes, FFT may result in high complexity and long system latency. This is because when FFT is used to adjust the sound's amplitude, the sound data is converted into a frequency domain (e.g., indexing the amplitude of the sound with respect to frequency), rather than keeping the sound in the time domain (indexing amplitude with respect to time). In examples described herein, the signal is kept in the time domain and the amplitude is adjusted using novel filtering methods. This reduces the processing power needed by not converting the signal into the frequency domain. Staying in the time domain means faster signal processing, and results in simpler hardware architectures in application specific integrated circuits. A variable filter may be employed, meaning the filter's coefficients are variable according to the current need (e.g. the input volume/amplitude).

The following disclosure will describe the examples discussed above, and other examples not discussed, as they relate to the figures.

FIG. 1A illustrates an electronic device 100A, in accordance with an example of the present invention. It is appreciated that the device depicted is a general diagram of any device (e.g., doorbell, security system, multi-media product with speakers and microphones, a smartphone or the like) that may benefit from the teachings of the instant disclosure. Electronic device 100A includes microphone 101, camera 103 (e.g., IR sensor, image sensor, or the like), volume control interface 105 (e.g., volume knob or buttons), controller 107 (e.g., general purpose processor, application specific integrated circuit, distributed system—processor connected to the internet or other servers that perform calculations, or the like), memory 109 (e.g., RAM, ROM, etc.), power system 111 (e.g., battery, power supply, or the like), communications system 113 (e.g., wireless internet, Bluetooth, RIFD, cable connection to the internet, or the like), and speaker 115 (e.g., any device that outputs sound—headphones, sound system, etc.). In the depicted example, all of the electronics may be included in housing 117 (e.g., plastic or metal casing), such as in a doorbell or security system. However, in other embodiments, the speaker may be remote from housing 117, for example, when speaker 115 is in a remote device like a phone, tablet, or the like. All devices shown are coupled to communicate with each other by wires (e.g., with a bus) or wirelessly (e.g., WiFi).

In the depicted example, microphone 101 is coupled to receive the sound and output sound data. The sound (e.g., any noise that the microphone picks up) has an amplitude that changes with respect to time (e.g., the sound may get louder or quieter), the sound includes one or more frequencies (e.g., higher pitch and lower pitch noises), and the sound data recorded by microphone 101 indexes the amplitude with respect to the time (e.g., how the volume changes over time). Controller 107 is coupled to microphone 101, and controller 107 includes logic that when executed by controller 107 causes electronic device 100A to perform operations. Operations may include receiving the sound data from microphone 101 with controller 107, and adjusting the amplitude of the sound, characterized by the sound data, across the one or more frequencies using a filter disposed in the logic. As stated above, the amplitude is adjusted while the amplitude is indexed with respect to the time (and not frequency), and then filtered sound data is output from the controller.

In the example shown, speaker 115 may be coupled to controller 107, and controller 107 may cause filtered sound to be output from speaker 115, where the filtered sound is derived from the filtered sound data. As depicted, volume control interface 105 is coupled to controller 107, and volume control interface 105 may determine the volume of the filtered sound output from speaker 115.

In the depicted example, memory 109 may be considered part of, or included in, controller 107. Memory 109 may store audio recordings in the time domain, and may similarly store video output in the time domain from camera 103. It is appreciated that, like controller 107, memory 109 may include a distributed system or partially distributed system to increase storage capacity.

In the illustrated example, power system 111 is coupled to the components depicted to supply power. Power system 111 may include batteries, a capacitor, a power converter, solar cells disposed on the device housing, or the like.

In one example, camera 103 is coupled to controller 107 to capture video data contemporaneously with the sound data, and the video data is output contemporaneously with the filtered sound data (e.g., to an external device like a smartphone or tablet). The camera may include a CMOS image sensor or the like, or may include a low resolution infrared (IR) sensor, or a combination thereof. Filtering may also be applied to the video data to remove oversaturated pixels or the like. In some embodiments, data from an IR sensor may be used to decide when microphone 101 should turn on. For example, microphone 101 may only turn on when the IR system senses movement.

As stated, communication system 113 may include a variety of wired and wireless communication components to send data to external devices. In some examples, communication system 113 may be coupled to controller 107 to send the filtered sound data to an external device (e.g., smartphone, tablet, or the like). Similarly, the external device may communicate back to the electronic device using these techniques. In some embodiments, the external device sends commands to the device disclosed herein, for example, the user may choose loudness equalization (e.g., the user adjusts the gain applied to the recorded sound based on personal preference). The user may be able to adjust bass, treble, or the like.

Figure 1B:
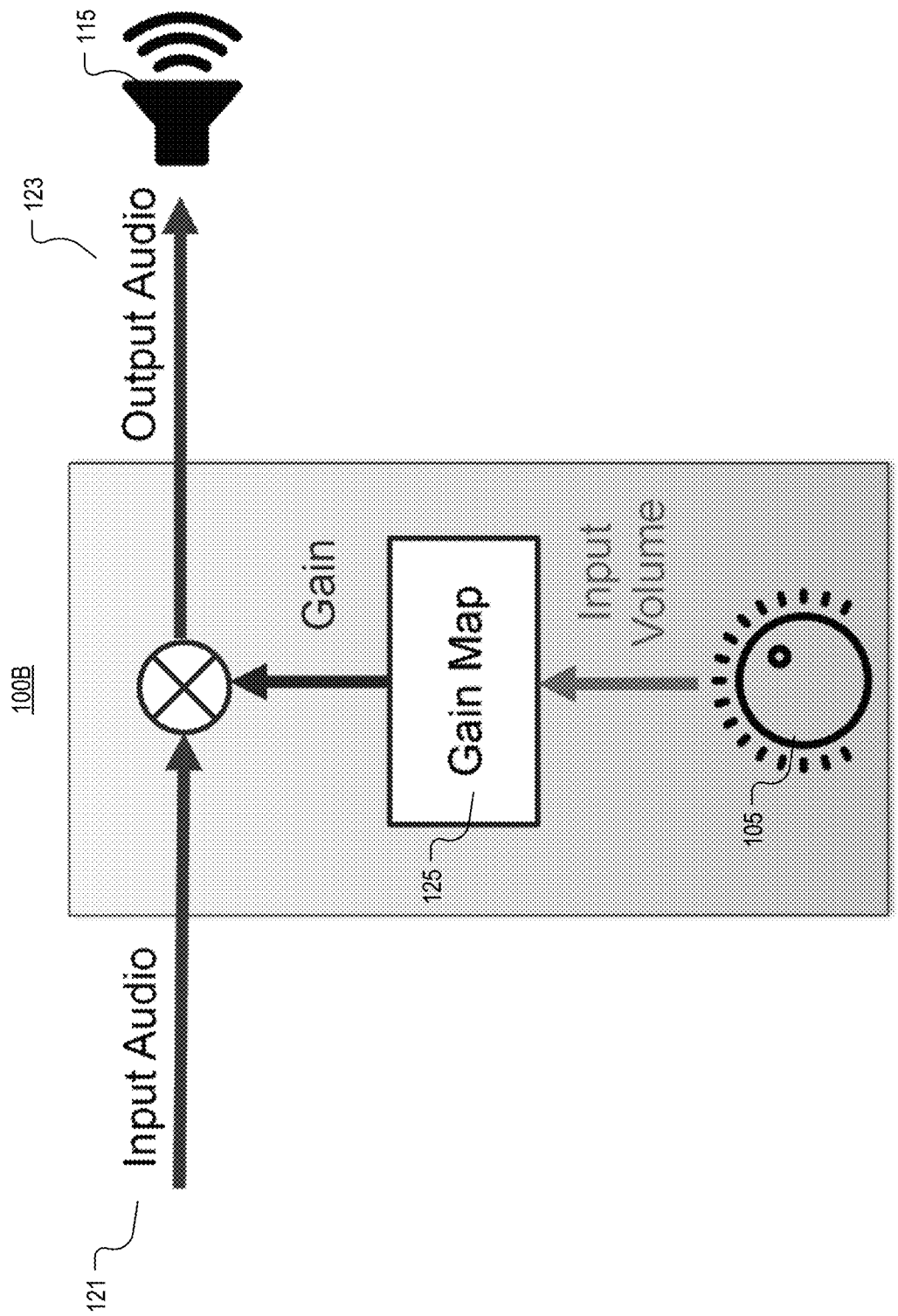
FIG. 1B illustrates a block diagram of the electronic device of FIG. 1A, in accordance with an example of the present invention.

FIG. 1B illustrates a block diagram 100B of logic in the electronic device of FIG. 1A, in accordance with an example of the present invention. The depicted example shows how the device in FIG. 1A may adjust the input volume. As shown, the input volume may be received by gain map 125 (described in greater detail later) from volume control interface 105 (which may, or may not, be local—e.g., a knob or remote, instructions sent to the electronic device via a smartphone, or the like). The gain map 125 is applied (e.g., in a summation block) to input audio 121 (which may come from microphone 101). After the gain map 125 is applied to the input audio 121, loudness equalized output audio 123 is output to speaker 115.

Figure 1C:
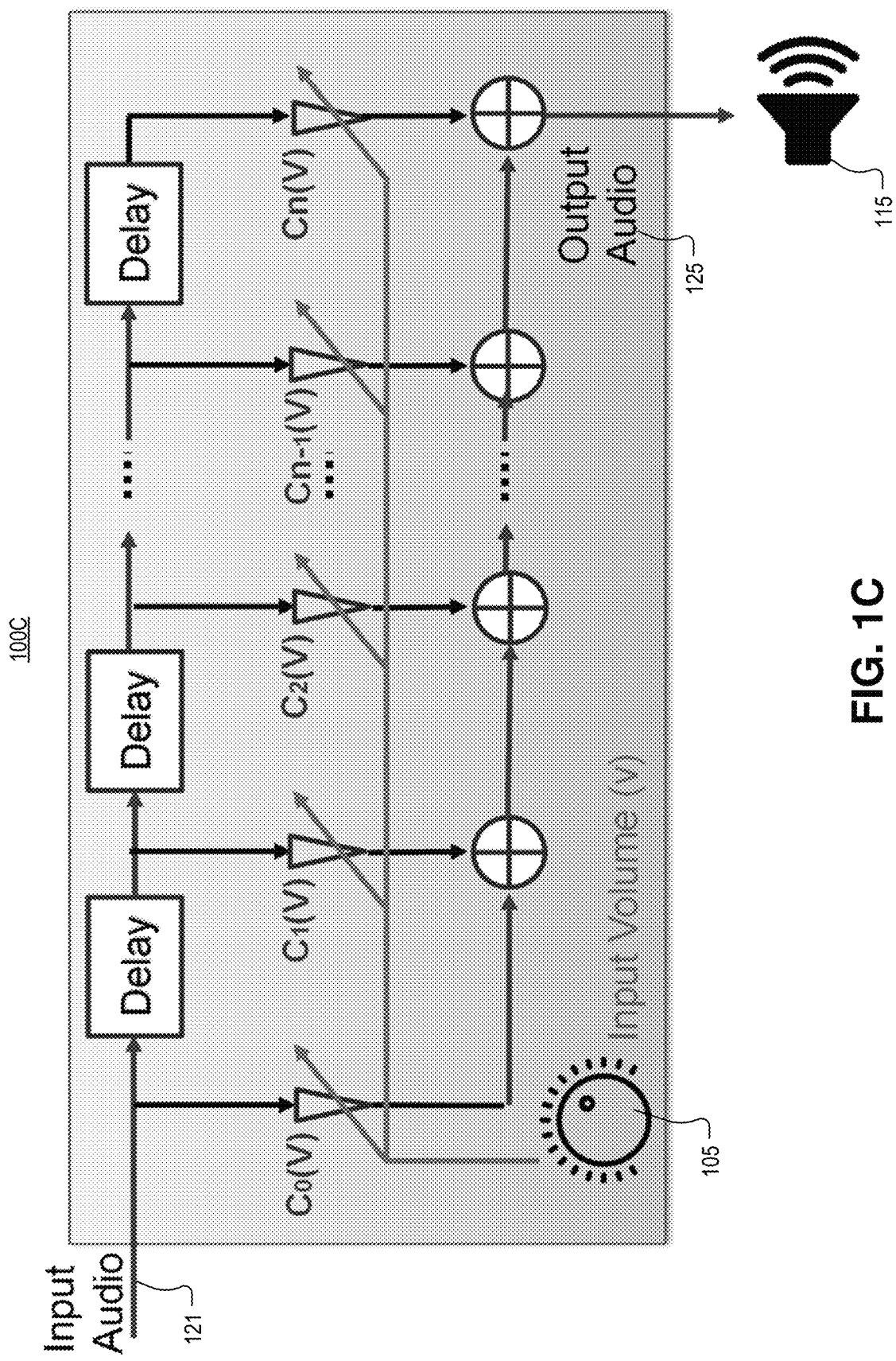
FIG. 1C illustrates a block diagram of the electronic device of FIG. 1A, in accordance with an example of the present invention.

FIG. 1C illustrates a block diagram 100C of the logic in electronic device of FIG. 1A, in accordance with an example of the present invention. The depicted diagram is similar to the block diagram in FIG. 1B, but the block diagram depicted in FIG. 1C shows additional detail.

Input volume is generally an index defined by application. For example, the volume index range is normally defined from 0 to 100 in a smartphone. In the depicted example, adjusting the amplitude includes using a variable filter, where coefficients of the variable filter are dynamic. Here, the variable filter is a finite impulse response (FIR) filter of order n. Coefficients, $C_0(V)$, $C_1(V)$, $C_2(V)$, ... $C_n(V)$, are the functions of input volume (V). Since each input volume corresponds to particular loudness equalization, here the device may use FIR filter design algorithms to calculate the coefficients for approaching the loudness equalization. For example, one algorithm may include the Parks-McClellan algorithm.

Figure 1D:
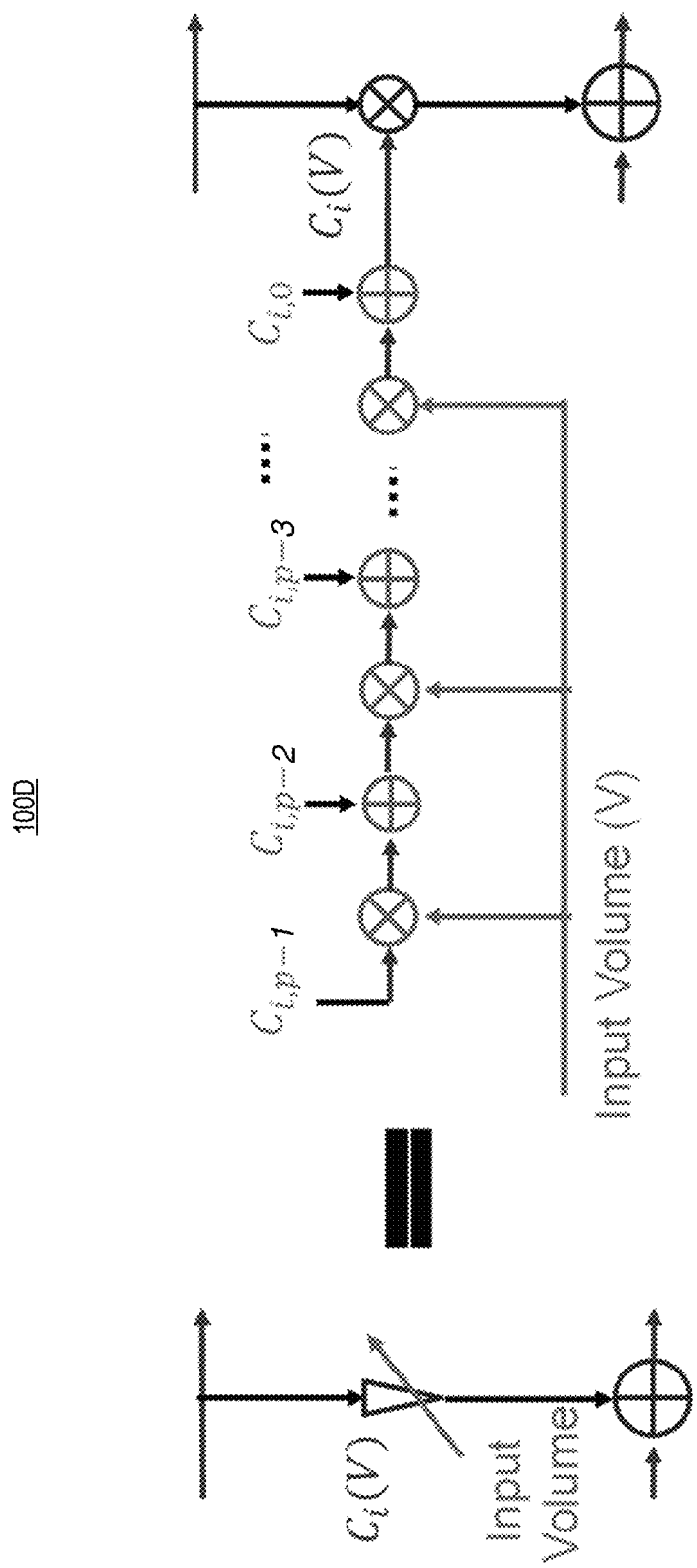
FIG. 1D illustrates an example of a polynomial function that may be implemented in the block diagram, in accordance with an example of the present invention.

FIG. 1D illustrates an example implementation of a polynomial function (implemented in hardware software or a combination of the two) in a block diagram, in accordance with an example of the present invention. As shown, coefficients are treated as a polynomial function of the input volume V, given by:

$$C_i(V) = C_{i,0} + C_{i,1}V + C_{i,2}V^2 + \ldots + C_{i,p-1}V^{p-1} \quad (1)$$

where $C_{i,j}$ for $j=0, 1, \ldots p-1$ are also calculated beforehand using a least-squares algorithm. Using this implementation, the controller just needs to store p*n polynomial coefficients for all input volume. Storing all FIR filter coefficients for every input volume may not be necessary. In practice, 2 or 3 orders of the polynomial function (p=2 or 3) can make for good performance. Therefore, the coefficients can be efficiently calculated using just a few multiplication and addition steps, in accordance with the teachings of the present disclosure.

Figure 2:
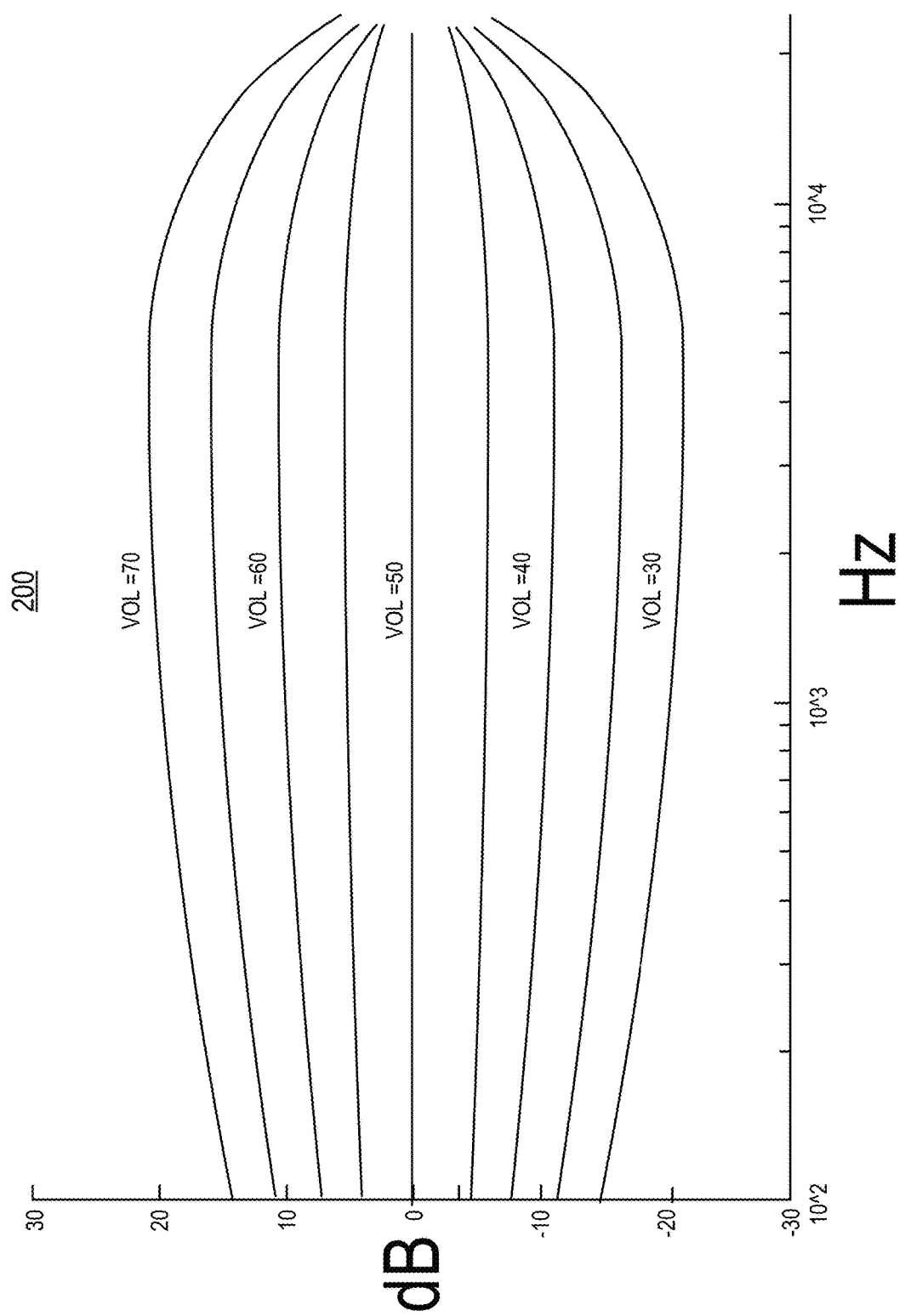
FIG. 2 illustrates the loudness equalization curves with different input volumes using the given specifications, in accordance with an example of the present invention.

FIG. 2 illustrates the designed loudness equalization curves with different input volumes using the given specification, in accordance with an example of the present invention. Here, a 32-order digital filter (n=32) with symmetric impulse response and a 3-order polynomial (p=3) fits for each coefficient. The filter is expected to approximate the loudness contour from 30 to 70 phons and result in good performance. This approach achieves both lower complexity and latency compared to the frequency domain approach, discussed above in accordance with the teachings of the present disclosure.

Figure 3:
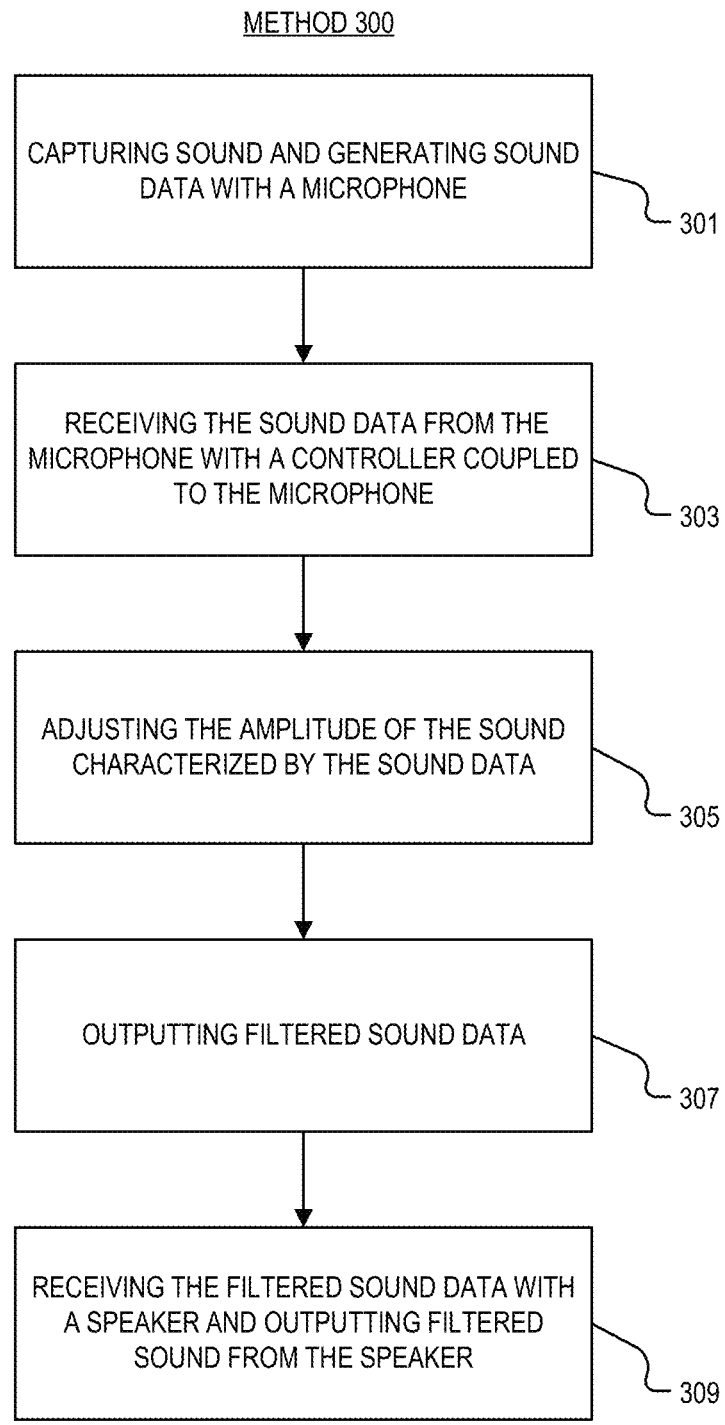
FIG. 3 illustrates a method of audio adjustment, in accordance with an example of the present invention.

FIG. 3 illustrates a method of audio adjustment, in accordance with an example of the present invention. One of ordinary skill in the art will appreciate that the blocks depicted in method 300 may occur in any order, and even in parallel, and that steps and features may have been omitted for simplicity of illustration. Moreover, additional blocks may be added to, or removed from, method 300 in accordance with the teachings of the present disclosure.

Block 301 shows capturing sound and generating sound data with a microphone. The sound may have an amplitude that changes with respect to time, and the sound includes one or more frequencies. The sound data indexes the amplitude with respect to the time.

Block 303 shows receiving the sound data from the microphone with a controller coupled to the microphone. The microphone may be remote (e.g., coupled to the controller via Bluetooth or the like) or the microphone may be local (e.g., in the same device and coupled to the controller by a bus).

Block 305 shows adjusting, using the controller, the amplitude of the sound characterized by the sound data across the one or more frequencies using a filter disposed in the logic (e.g., hardware, software, or a combination thereof). The amplitude is adjusted while the amplitude is indexed with respect to the time domain (and not while the amplitude is indexed with respect to frequency or another variable). Put another way, when the amplitude of the sound is adjusted, the sound data is not converted into a frequency domain, where the frequency domain indexes the amplitude with respect to the one or more frequencies.

In one embodiment, adjustment may be in response to controlling a volume of the sound output from the speaker using a volume control interface coupled to the controller. Further, adjusting the amplitude may include using a variable filter, where coefficients of the variable filter are dynamic (e.g., finite input response filter, where the coefficients are functions of the amplitude of the sound). In some embodiments, the amplitude of the various frequencies may be adjusted in response to the age of the user being input to the system (e.g., the sound data is optimized for users of a particular age—narrower range of frequencies amplified for older users).

Block 307 depicts outputting filtered sound data (e.g., loudness equalized sound data across a frequency range). The filtered sound data may be output to memory, or a communication system (e.g., communication system in FIG. 1A).

Block 309 depicts receiving the filtered sound data with a speaker, and outputting filtered sound from the speaker. The filtered sound is derived from the filtered sound data. In this embodiment, receiving the filtered sound data with a speaker may include sending the filtered sound data to an external device (e.g., a remote speaker) using a communications system coupled to the controller.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. An electronic device to equalize a sound input signal, comprising:
a microphone coupled to receive the sound input signal and output sound data, wherein the sound input signal has an amplitude that changes with respect to time, and the sound input signal includes one or more frequencies, and wherein the sound data indexes the amplitude with respect to the time; and
a controller coupled to the microphone, wherein the controller includes logic that when executed by the controller causes the electronic device to perform operations, including:
receiving the sound data from the microphone with the controller;
adjusting the amplitude of the sound input signal included in the sound data, across the one or more frequencies using a filter disposed in the logic while the amplitude is indexed with respect to the time, wherein the filter has dynamic coefficients $C_n(V)$ of an order n that are functions of the amplitude of the sound input signal, wherein $C_n(V)$ is given by:

$$C_n(V)=C_{n,0}+C_{n,1}V+C_{n,2}V^2+\ldots+C_{n,p-1}V^{p-1},$$

wherein V is the sound input signal, p is an integer, and $C_{n,j}$, j=0, 1, . . . , p−1 are polynomial coefficients; and
outputting filtered sound data.

2. The electronic device of claim 1, further comprising:
a speaker coupled to the controller, wherein the controller further includes logic that when executed by the controller causes the electronic device to perform operations, including:
outputting filtered sound from the speaker, wherein the filtered sound is derived from the filtered sound data.

3. The electronic device of claim 2, further comprising a volume control interface coupled to the controller, wherein the volume control interface determines a volume of the filtered sound data from the speaker.

4. The electronic device of claim 1, wherein the filter includes a finite input response filter.

5. The electronic device of claim 1 further comprising:
a power system, coupled to provide power to the microphone and the controller, and disposed within the electronic device.

6. The electronic device of claim 1, further comprising:
a communications system coupled to the controller, wherein the controller further includes logic that when executed by the controller causes the electronic device to perform operations, including:
sending the filtered sound data to an external device using the communications system.

7. The electronic device of claim 1, wherein the electronic device includes a doorbell.

8. The electronic device of claim 1, further comprising a camera coupled to the controller to capture video data contemporaneously with the sound data, and wherein the video data is output contemporaneously with the filtered sound data.

9. The electronic device of claim 1, wherein when the amplitude of the sound input signal is adjusted, the sound data is not converted into a frequency domain, wherein the frequency domain indexes the amplitude with respect to the one or more frequencies.

10. A method of audio adjustment, comprising:
capturing a sound input signal and generating sound data with a microphone, wherein the sound input signal has an amplitude that changes with respect to time, and the sound input signal includes one or more frequencies, and wherein the sound data indexes the amplitude with respect to the time;

receiving the sound data from the microphone with a controller coupled to the microphone;

adjusting using the controller, the amplitude of the sound input signal included in the sound data, across the one or more frequencies using a filter disposed in logic of the controller while the amplitude is indexed with respect to the time, wherein the filter has dynamic coefficients $C_n(V)$ of an order n that are functions of the amplitude of the sound input signal, wherein $C_n(V)$ is given by:

$$C_n(V)=C_{n,0}+C_{n,1}V+C_{n,2}V^2+\ldots+C_{n,p-1}V^{p-1},$$

wherein V is the sound input signal, p is an integer, and $C_{n,j}$, j=0, 1, . . . , p−1 are polynomial coefficients; and outputting filtered sound data.

11. The method of claim 10, further comprising:

receiving the filtered sound data with a speaker; and outputting filtered sound from the speaker, wherein the filtered sound is derived from the filtered sound data.

12. The method of claim 11, further comprising controlling a volume of the filtered sound data from the speaker using a volume control interface coupled to the controller.

13. The method of claim 10, wherein the filter includes a finite input response filter.

14. The method of claim 10 further comprising supplying power to the microphone and the controller using a power system.

15. The method of claim 10, further comprising sending the filtered sound data to an external device using a communications system coupled to the controller.

16. The method of claim 10, wherein the microphone and the controller are included in a doorbell.

17. The method of claim 10, further comprising capturing video data contemporaneously with the sound data using a camera, and wherein the video data is output contemporaneously with the filtered sound data.

18. The method of claim 10, wherein when the amplitude of the sound input signal is adjusted, the sound data is not converted into a frequency domain, wherein the frequency domain indexes the amplitude with respect to the one or more frequencies.

* * * * *